(12) United States Patent
Campbell et al.

(10) Patent No.: US 9,301,433 B2
(45) Date of Patent: Mar. 29, 2016

(54) VAPOR-COMPRESSION REFRIGERATION APPARATUS WITH BACKUP AIR-COOLED HEAT SINK AND AUXILIARY REFRIGERANT HEATER

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Michael J. Ellsworth, Jr., Poughkeepsie, NY (US); Madhusudan K. Iyengar, Foster City, CA (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 187 days.

(21) Appl. No.: 14/134,017

(22) Filed: Dec. 19, 2013

(65) Prior Publication Data

US 2014/0102668 A1    Apr. 17, 2014

Related U.S. Application Data

(63) Continuation of application No. 12/939,563, filed on Nov. 4, 2010, now abandoned.

(51) Int. Cl.
*F25D 23/12* (2006.01)
*H05K 7/20* (2006.01)
(Continued)

(52) U.S. Cl.
CPC ............... *H05K 7/208* (2013.01); *F25B 39/02* (2013.01); *F25B 49/02* (2013.01);
(Continued)

(58) Field of Classification Search
CPC ............ H05K 7/208; H05K 7/20836; H05K 7/20809; F25B 49/02; F25B 2400/01; F25B 2500/06; F25B 39/02

USPC ................... 165/177, 185, 58, 80.1, 80.2, 61; 361/697; 219/552; 174/258
See application file for complete search history.

(56) References Cited

U.S. PATENT DOCUMENTS 4,000,626 A    1/1977    Webber
4,091,637 A    5/1978    Vogel et al.
(Continued)

FOREIGN PATENT DOCUMENTS

CN    1734212 A    2/2006
DE    29903863 U1    11/1999
(Continued)

OTHER PUBLICATIONS

Torok et al., "Packaging Design of the IBM System z10 Enterprise Class Platform Central Electronic Complex", IBM Journal of Research & Development, vol. 53, No. 1, Paper 9 (2009).
(Continued)

*Primary Examiner* — Marc Norman
*Assistant Examiner* — Ana Vazquez
(74) *Attorney, Agent, or Firm* — Steven Chiu, Esq.; Kevin P. Radigan, Esq.; Heslin Rothenberg Farley & Mesiti P.C.

(57) ABSTRACT

Apparatus and method are provided for cooling an electronic component. The apparatus includes a refrigerant evaporator in thermal communication with a component(s) to be cooled, and a refrigerant loop coupled in fluid communication with the evaporator for facilitating flow of refrigerant through the evaporator. The apparatus further includes a compressor in fluid communication with a refrigerant loop, an air-cooled heat sink coupled to the refrigerant evaporator, for providing backup cooling to the electronic component in a backup, air cooling mode, and a controllable refrigerant heater coupled to the heat sink. The refrigerant heater is in thermal communication across the heat sink with refrigerant passing through the refrigerant evaporator, and is controlled in a primary, refrigeration cooling mode to apply an auxiliary heat load to refrigerant passing through the refrigerant evaporator to ensure that refrigerant in the refrigerant loop entering the compressor is in a superheated thermodynamic state.

8 Claims, 14 Drawing Sheets

(51) Int. Cl.
*F25B 39/02* (2006.01)
*F25B 49/02* (2006.01)

(52) U.S. Cl.
CPC ....... *H05K 7/20809* (2013.01); *H05K 7/20836* (2013.01); *F25B 2400/01* (2013.01); *F25B 2500/06* (2013.01); *Y10T 29/49826* (2015.01)

(56) References Cited

U.S. PATENT DOCUMENTS

| | | |
|---|---|---|
| 4,313,310 A | 2/1982 | Kobayashi et al. |
| 4,571,951 A | 2/1986 | Szymaszek |
| 4,598,764 A | 7/1986 | Beckey |
| 4,831,830 A | 5/1989 | Swenson |
| 4,934,155 A | 6/1990 | Lowes |
| 4,993,481 A | 2/1991 | Kamimoto et al. |
| 5,060,481 A | 10/1991 | Bartlett et al. |
| 5,217,063 A | 6/1993 | Scaringe et al. |
| 5,412,884 A | 5/1995 | Staples et al. |
| 5,514,595 A | 5/1996 | Olds et al. |
| 5,597,533 A | 1/1997 | Olds et al. |
| 5,737,923 A | 4/1998 | Gilley et al. |
| 5,860,280 A | 1/1999 | Recine, Sr. et al. |
| 5,867,990 A | 2/1999 | Ghoshal |
| 5,963,458 A | 10/1999 | Cascia |
| 5,970,731 A | 10/1999 | Hare et al. |
| 6,003,319 A | 12/1999 | Gilley et al. |
| 6,037,567 A | 3/2000 | Inoue et al. |
| 6,164,076 A | 12/2000 | Chu et al. |
| 6,213,194 B1 | 4/2001 | Chrysler et al. |
| 6,305,463 B1 | 10/2001 | Salmonson |
| 6,351,950 B1 | 3/2002 | Duncan |
| 6,397,618 B1 | 6/2002 | Chu et al. |
| 6,474,074 B2 | 11/2002 | Ghoshal |
| 6,557,354 B1 | 5/2003 | Chu et al. |
| 6,705,089 B2 | 3/2004 | Chu et al. |
| 6,747,872 B1 | 6/2004 | Patel et al. |
| 6,760,221 B2 | 7/2004 | Goth et al. |
| 6,786,081 B1 | 9/2004 | Hildebrandt et al. |
| 6,820,435 B2 | 11/2004 | Anderson et al. |
| 6,829,145 B1 | 12/2004 | Corrado et al. |
| 6,845,622 B2 | 1/2005 | Sauciuc et al. |
| 6,993,920 B2 | 2/2006 | Lifson et al. |
| 7,073,341 B2 | 7/2006 | Tongu et al. |
| 7,085,626 B2 | 8/2006 | Harrod et al. |
| 7,086,247 B2 | 8/2006 | Campbell et al. |
| 7,089,752 B2 | 8/2006 | Jeong et al. |
| 7,278,269 B2 | 10/2007 | Pham et al. |
| 7,310,953 B2 | 12/2007 | Pham et al. |
| 7,342,787 B1 | 3/2008 | Bhatia |
| 7,382,047 B2 | 6/2008 | Chen et al. |
| 7,401,472 B2 | 7/2008 | Manole |
| 7,554,808 B2 | 6/2009 | Scott et al. |
| 7,626,407 B2 | 12/2009 | Kabbani |
| 7,788,937 B2 | 9/2010 | Kawakatsu et al. |
| 7,788,941 B2 | 9/2010 | Campbell et al. |
| 7,963,119 B2 | 6/2011 | Campbell et al. |
| 8,018,718 B2 | 9/2011 | Goth et al. |
| 2001/0000880 A1 | 5/2001 | Chu et al. |
| 2003/0000231 A1 | 1/2003 | Pokharna et al. |
| 2003/0014987 A1 | 1/2003 | Levenduski et al. |
| 2005/0122685 A1 | 6/2005 | Chu et al. |
| 2005/0262869 A1 | 12/2005 | Tongu et al. |
| 2005/0262870 A1 | 12/2005 | Narayanamurthy et al. |
| 2006/0042289 A1 | 3/2006 | Campbell et al. |
| 2007/0044493 A1 | 3/2007 | Kearney et al. |
| 2007/0062181 A1 | 3/2007 | Williamson et al. |
| 2007/0107453 A1 | 5/2007 | Cutting et al. |
| 2007/0199335 A1 | 8/2007 | Innes |
| 2008/0307806 A1 | 12/2008 | Campbell et al. |
| 2009/0038317 A1 | 2/2009 | Otey |
| 2009/0126909 A1 | 5/2009 | Ellsworth, Jr. et al. |
| 2009/0158768 A1 | 6/2009 | Rafalovich et al. |
| 2010/0005820 A1 | 1/2010 | Harig |
| 2010/0073863 A1 | 3/2010 | Matsushima et al. |
| 2010/0079952 A1 | 4/2010 | Liang et al. |
| 2011/0180241 A1 | 7/2011 | So et al. |
| 2011/0197612 A1 | 8/2011 | Campbell et al. |
| 2012/0111027 A1 | 5/2012 | Campbell et al. |
| 2012/0111028 A1 | 5/2012 | Campbell et al. |
| 2012/0111034 A1 | 5/2012 | Campbell et al. |
| 2012/0111035 A1 | 5/2012 | Campbell et al. |
| 2012/0111036 A1 | 5/2012 | Campbell et al. |
| 2012/0111037 A1 | 5/2012 | Campbell et al. |
| 2012/0111038 A1 | 5/2012 | Campbell et al. |
| 2012/0125022 A1 | 5/2012 | Maybury et al. |
| 2012/0125573 A1 | 5/2012 | Rubenstein et al. |
| 2012/0210731 A1 | 8/2012 | Campbell et al. |

FOREIGN PATENT DOCUMENTS

| | | |
|---|---|---|
| DE | 19903743 A1 | 8/2000 |
| EP | 0025665 A1 | 3/1981 |
| EP | 1031808 A2 | 8/2000 |
| JP | 1098885 A | 4/1989 |
| JP | 10223442 A | 8/1998 |
| JP | 2006162246 A | 6/2006 |
| JP | 2006278923 A * | 10/2006 |
| JP | 2008014563 A | 1/2008 |
| JP | 2010-121930 A | 6/2010 |
| KR | 2005-026591 A | 3/2005 |
| WO | WO2010017536 A2 | 2/2010 |

OTHER PUBLICATIONS

Ellsworth, Jr. et al., "The Evolution of Water Cooling for IBM Larger Server Systems: Back to the Future", IBM Corporation, Poughkeepsie, NY (2008).

Campbell et al., International Search Report and Written Opinion for International Application No. PCT/EP2008/055758, dated Oct. 29, 2008.

Simons, Robert E., "Application of Thermoelectric Coolers for Module Cooling Enhancement" (http://www.electronics-cooling.com/2000/05/application-of-thermoelectric-coolers-for-module-cooling-enhancement/) (May 1, 2000).

Tellurex, "An Introduction to Thermoelectrics", (http://www.tellurex.com/pdf/introduction-to-thermoelectrics.pdf) (2010).

Tellurex, "An Introduction to Temperature Control of Thermoelectric Systems", (http://www.tellurex.com/pdf/introduction-to-temperature-control.pdf) (2010).

Tellurex, "Frequently Asked Questions About Our Power Generation Technology", (http://www.tellurex.com/pdf/seebeck-faq.pdf) (2010).

Tellurex, "Frequently Asked Questions About Our Cooling and Heating Technology", (http://www.tellurex.com/pdf/peltier-faq.pdf) (2010).

* cited by examiner

VAPOR-COMPRESSION REFRIGERATION APPARATUS WITH BACKUP AIR-COOLED HEAT SINK AND AUXILIARY REFRIGERANT HEATER

CROSS-REFERENCE TO RELATED APPLICATIONS

This application is a continuation of U.S. application Ser. No. 12/939,563 entitled, "VAPOR-COMPRESSION REFRIGERATION APPARATUS WITH BACKUP AIR-COOLED HEAT SINK AND AUXILIARY REFRIGERANT HEATER", filed Nov. 4, 2010, which published May 10, 2012, as U.S. Patent Publication No. US 2012-0111038 A1, and which is hereby incorporated herein by reference in its entirety.

BACKGROUND

The present invention relates to heat transfer mechanisms, and more particularly, to cooling apparatuses, liquid-cooled electronics racks and methods of fabrication thereof for removing heat generated by one or more electronic components of the electronics rack.

The power dissipation of integrated circuit chips, and the modules containing the chips, continues to increase in order to achieve increases in processor performance. This trend poses a cooling challenge at both the module and system levels. Increased airflow rates are needed to effectively cool higher power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device(s) or by increasing the rotational speed (i.e., RPMs) of an existing air moving device. However, this approach is becoming problematic at the rack level in the context of a data center.

BRIEF SUMMARY

In one aspect, the shortcomings of the prior art are overcome and additional advantages are provided through the provision of an apparatus for facilitating cooling of an electronic component. The apparatus includes: a refrigerant evaporator, a refrigerant loop, a compressor, an air-cooled heat sink, and a controllable refrigerant heater. The refrigerant evaporator is in thermal communication with the electronic component, and includes at least one channel therein for accommodating flow of refrigerant therethrough. The refrigerant loop is coupled in fluid communication with the at least one channel of the refrigerant evaporator to facilitate flow of refrigerant through the evaporator, and the compressor is coupled in fluid communication with the refrigerant loop. The air-cooled heat sink is distinct from and physically coupled to the refrigerant evaporator, and provides backup cooling to the electronic component in a backup, air cooling mode. The controllable refrigerant heater is coupled to the air-cooled heat sink, and is in thermal communication across the air-cooled heat sink with refrigerant passing through the refrigerant evaporator, and the refrigerant evaporator, air-cooled heat sink, and controllable refrigerant heater are physically stacked together, with the air-cooled heat sink disposed, at least in part, between the controllable refrigerant heater and the refrigerant evaporator. The controllable refrigerant heater is controlled in a primary, refrigeration cooling mode to apply an auxiliary heat load to refrigerant passing through the refrigerant evaporator to ensure that the refrigerant in the refrigerant loop entering the compressor is in a superheated thermodynamic state.

In another aspect, a cooled electronic system is provided which includes an electronic component, and an apparatus for cooling the electronic component. The apparatus includes: a refrigerant evaporator, a refrigerant loop, a compressor, an air-cooled heat sink, and a controllable refrigerant heater. The refrigerant evaporator is in thermal communication with the electronic component, and includes at least one channel therein for accommodating flow of refrigerant therethrough. The refrigerant loop is coupled in fluid communication with the at least one channel of the refrigerant evaporator to facilitate flow of refrigerant through the evaporator, and the compressor is coupled in fluid communication with the refrigerant loop. The air-cooled heat sink is distinct from and physically coupled to the refrigerant evaporator, and provides backup cooling to the electronic component in a backup, air cooling mode. The controllable refrigerant heater is coupled to the air-cooled heat sink, and is in thermal communication across the air-cooled heat sink with refrigerant passing through the refrigerant evaporator, and the refrigerant evaporator, air-cooled heat sink, and controllable refrigerant heater are physically stacked together, with the air-cooled heat sink disposed, at least in part, between the controllable refrigerant heater and the refrigerant evaporator. The controllable refrigerant heater is controlled in a primary, refrigeration cooling mode to apply an auxiliary heat load to refrigerant passing through the refrigerant evaporator to ensure that the refrigerant in the refrigerant loop entering the compressor is in a superheated thermodynamic state.

In a further aspect, a method of facilitating cooling of an electronic component is provided. The method includes: coupling in thermal communication a refrigerant evaporator to the electronic component, the refrigerant evaporator comprising at least one channel therein for accommodating flow of refrigerant therethrough; providing a refrigerant loop in fluid communication with the at least one channel of the refrigerant evaporator to facilitating flow of refrigerant therethrough; coupling a compressor in fluid communication with the refrigerant loop; coupling a distinct, air-cooled heat sink to the refrigerant evaporator for providing backup cooling to the electronic component in a backup, air cooling mode; and coupling a controllable refrigerant heater to the air-cooled heat sink, the controllable refrigerant heater being in thermal communication across the air-cooled heat sink with refrigerant passing through the refrigerant evaporator, wherein the refrigerant evaporator, air-cooled heat sink, and controllable refrigerant heater are physically stacked together, with the air-cooled heat sink disposed, at least in part, between the controllable refrigerant heater and the refrigerant evaporator, and the controllable refrigerant heater being controlled in a primary, refrigeration cooling mode to apply a conductively transferred, auxiliary heat load to refrigerant passing through the refrigerant evaporator to ensure that refrigerant in the refrigerant loop entering the compressor is in a superheated thermodynamic state.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
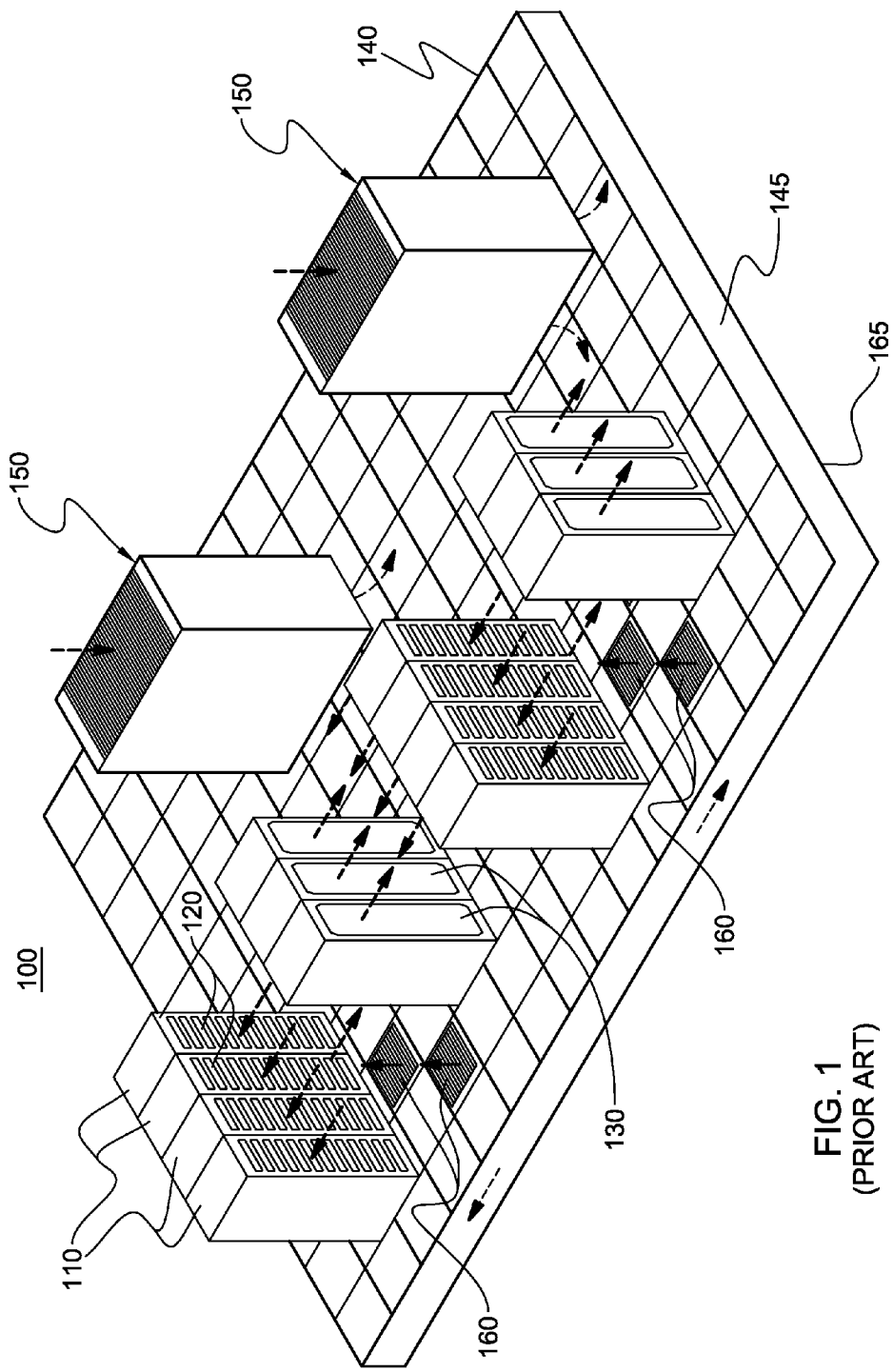
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein.

Unless otherwise specified, "refrigerant evaporator" refers to a heat-absorbing mechanism or structure within a refrigeration loop. The refrigerant evaporator is alternatively referred to as a "sub-ambient evaporator" when temperature of the refrigerant passing through the refrigerant evaporator is below the temperature of ambient air entering the electronics rack. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

As used herein, the phrase "controllable refrigerant heater" refers to an adjustable heater which allows active control of an auxiliary heat load applied to refrigerant passing through the refrigerant loop of a cooling apparatus, such as described herein. In one example, the controllable refrigerant heater comprises one or more electrical resistance elements coupled in thermal communication with the refrigerant passing through the refrigerant evaporator and powered by an electrical power source.

One example of the refrigerant employed in the examples below is R134a refrigerant. However, the concepts disclosed herein are readily adapted to use with other types of refrigerant. For example, the refrigerant may alternatively comprise R245fa, R404, R12, or R22 refrigerant.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System Z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
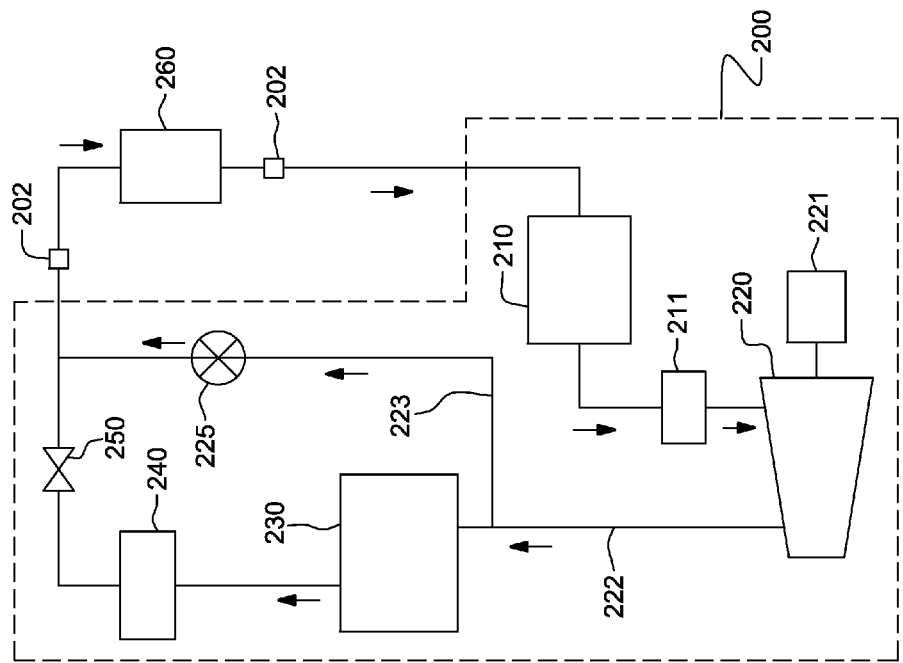
FIG. 2B is a schematic of one embodiment of a vapor-compression refrigeration system for cooling an evaporator (or cold plate) coupled to a high heat flux electronic component (e.g., module) to be cooled, in accordance with an aspect of the present invention.
Figure 2A:
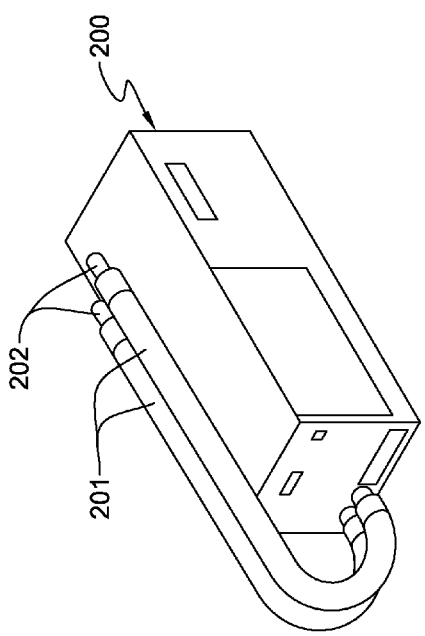
FIG. 2A is an isometric view of one embodiment of a modular refrigeration unit (MRU) and its quick connects for attachment to a cold plate and/or evaporator disposed within an electronics rack to cool one or more electronic components (e.g., modules) thereof, in accordance with an aspect of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Letters Pat. No. 5,970,731.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multi-chip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
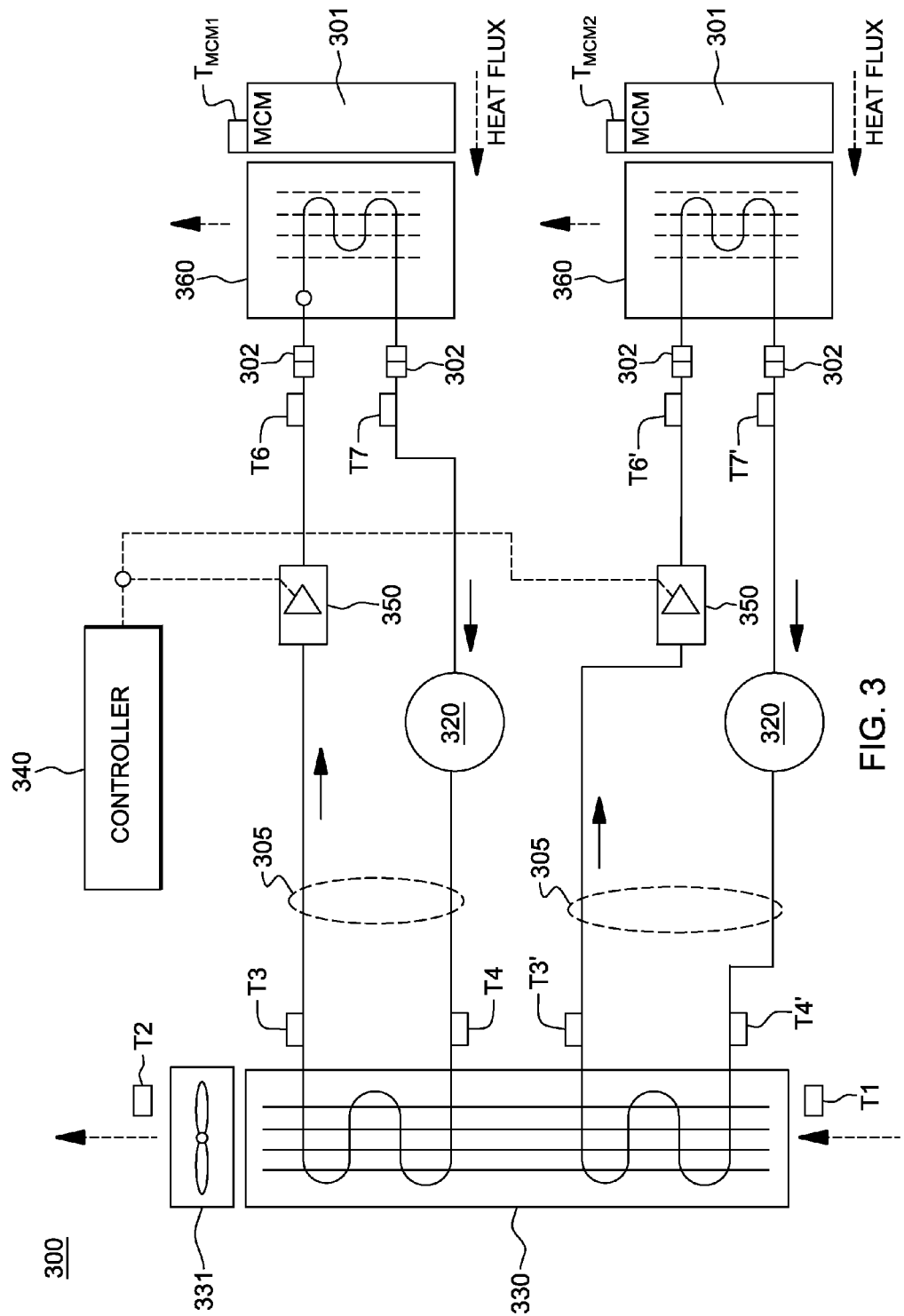
FIG. 3 is an schematic of an alternate embodiment of a vapor-compression refrigeration system for cooling multiple evaporators coupled to respective electronic components to be cooled, in accordance with an aspect of the present invention.

FIG. 3 depicts an alternate embodiment of a modular refrigeration unit 300, which may be employed within an electronics rack, in accordance with an aspect of the present invention. Modular refrigeration unit 300 includes (in this example) two refrigerant loops 305, or i.e., sets of refrigerant supply and exhaust hoses, coupled to respective refrigerant evaporators (or cold plates) 360 via quick connect couplings 302. Each refrigerant evaporator 360 is in thermal communication with a respective electronic component 301 (e.g., multichip module (MCM)) for facilitating cooling thereof. Refrigerant loops 305 are independent, and shown to include a compressor 320, a respective condenser section of a shared condenser 330 (i.e., a refrigerant-to-air heat exchanger), and an expansion (and flow control) valve 350, which is employed by a controller 340 to maintain temperature of the electronic component at a steady temperature level, e.g., 29° C. In one embodiment, the expansion valves 350 are controlled by controller 340 with reference to temperature of the respective electronic component 301 $T_{MCM1}$, $T_{MCM2}$. The refrigerant and coolant loops may also contain further sensors, such as sensors for condenser air temperature IN T1, condenser air temperature OUT T2, temperature T3, T3' of high-pressure liquid refrigerant flowing from the condenser 330 to the respective expansion valve 350, temperature T4, T4' of high-pressure refrigerant vapor flowing from each compressor 320 to the respective condenser section 330, temperature T6, T6' of low-pressure liquid refrigerant flowing from each expansion valve 350 into the respective evaporator 360, and temperature T7, T7' of low-pressure vapor refrigerant flowing from the respective evaporator 360 towards the compressor 320. Note that in this implementation, the expansion valves 350 operate to actively throttle the pumped refrigerant flow rate, as well as to function as expansion orifices to reduce the temperature and pressure of refrigerant passing through it.

In situations where electronic component 301 temperature decreases (i.e., the heat load decreases), the respective expansion valve 350 is partially closed to reduce the refrigerant flow passing through the associated evaporator 360 in an attempt to control temperature of the electronic component. If temperature of the component increases (i.e., heat load increases), then the controllable expansion valve 350 is opened further to allow more refrigerant flow to pass through the associated evaporator, thus providing increased cooling to the component. In extreme conditions, there is the possibility of too much refrigerant flow being allowed to pass through the evaporator, possibly resulting in partially-evaporated fluid, (i.e., liquid-vapor mixture) being returned to the respective compressor, which can result in compressor valve failure due to out-of-specification pressures being imposed on the compressor valve. There is also the possibility of particulate and chemical contamination over time resulting from oil breakdown inside the loop accumulating within the controllable expansion valve. Accumulation of contamination within the valve can lead to both valve clogging and erratic valve behavior.

In accordance with an aspect of the present invention, an alternate implementation of a vapor-compression refrigeration apparatus is described below with reference to FIGS. 4A-5. This alternate implementation does not require a mechanical flow control and adjustable expansion valve, such as described above in connection with the modular refrigeration unit of FIG. 3, and ensures that refrigerant entering the compressor is in a superheated thermodynamic state. In the alternate implementation of FIGS. 4A-5, an air-cooled heat sink is advantageously provided coupled to the refrigerant evaporator to provide backup air-cooling to the electronic component should, for example, primary refrigeration cooling of the electronic component fail.

Figure 4A:
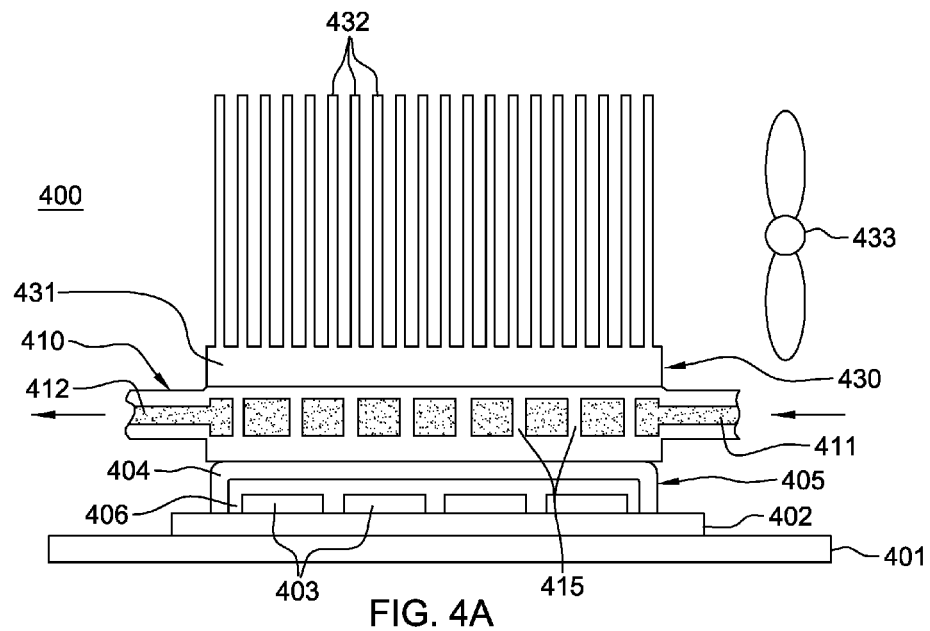
FIGS. 4A & 4B depict one embodiment of a portion of a cooled electronic system comprising a vapor-compression refrigeration apparatus coupled to an electronic component to be cooled, and including an air-cooled heat sink providing backup air cooling to the electronic component across the refrigerant evaporator, wherein a primary, refrigeration cooling mode is illustrated in FIG. 4A, and a backup, air cooling mode is illustrated in FIG. 4B, in accordance with an aspect of the present invention.

By way of example, FIG. 4A is a partial depiction of a cooled electronic system comprising a vapor-compression refrigeration apparatus coupled to an electronic component to be cooled, and including an air-cooled heat sink providing backup air-cooling to the electronic component across the refrigerant evaporator. In FIG. 4A, air-moving device 433 is OFF, and the cooling apparatus is in primary, refrigeration cooling mode, and in FIG. 4B, air-moving device 433 is ON, meaning that the refrigeration cooling has been suspended or has failed, and the cooling apparatus is in a backup, air cooling mode.

Figure 4B:
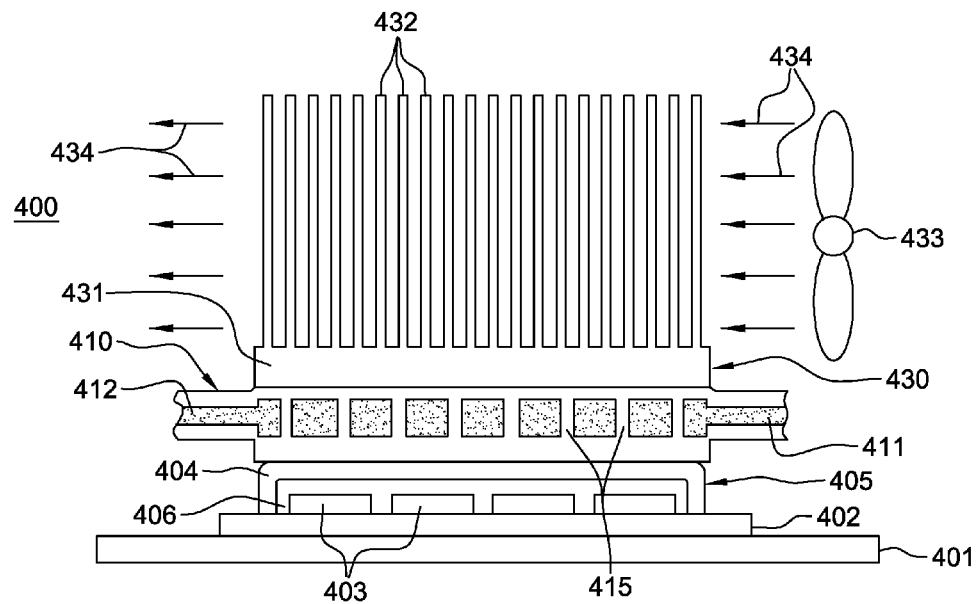

In the example of FIGS. 4A & 4B, electronic component 405 to be cooled comprises a multichip module (MCM) with multiple integrated circuit chips 403 (such as processor chips) disposed on a substrate 402, shown residing on a printed circuit board 401. In this example, a thermal interface material 406 facilitates heat conduction from the multiple integrated circuit chips 403 to a thermally conductive cap 404 of electronic component 405. Electronic component 405 is shown coupled to a first main surface of a refrigerant evaporator 410 of the vapor-compression refrigeration apparatus. Air-cooled heat sink 430 is shown coupled to a second main surface of refrigerant evaporator 410, wherein the first main surface and second main surface are substantially parallel surfaces of the evaporator. In the embodiment illustrated, refrigerant evaporator 410 includes a refrigerant inlet 411 and a refrigerant outlet 412 coupled to a refrigerant loop (not shown) through which refrigerant circulates within the vapor-compression refrigeration apparatus. A plurality of heat conduction structures 415 are illustrated, which provide (in one aspect) heat conduction paths from electronic component 405 to air-cooled heat sink 430 in the backup, air cooling mode. As shown, heat conduction structures 415 are in contact with refrigerant passing through refrigerant evaporator 410.

Air-cooled heat sink 430 comprises a heat sink base 431 and a plurality of thermally conductive heat sink fins 432 extending from heat sink base 431. By way of example, the plurality of thermally conductive heat sink fins 432 extends from heat sink base 431 away from refrigerant evaporator 410. In operation, the solid material of the air-cooled heat sink is thermally coupled to the electronic component via the heat conduction structures 415 within refrigerant evaporator 410. In one embodiment, these heat conduction structures could pass through the outer housing of refrigerant evaporator 410 and extend into heat sink base 431 of the air-cooled heat sink 430. Alternatively, a thermal interface material could be employed to couple air-cooled heat sink 430 to the second main surface of refrigerant evaporator 410. In the primary or normal mode of operation, air-moving device 433 is OFF, and the heat load of the electronic component is exhausted to the refrigerant passing through refrigerant evaporator 410. When there is a loss of cooling in the refrigeration loop (for example, the vapor-compression refrigeration apparatus has been shut down due to a refrigerant leak or needed MRU maintenance), air-moving device 433 is turned ON and heat from the electronic component is conducted to air-cooled heat sink 430 for dissipation to the airflow 434 passing through the thermally conductive heat sink fins 432.

Figure 5:
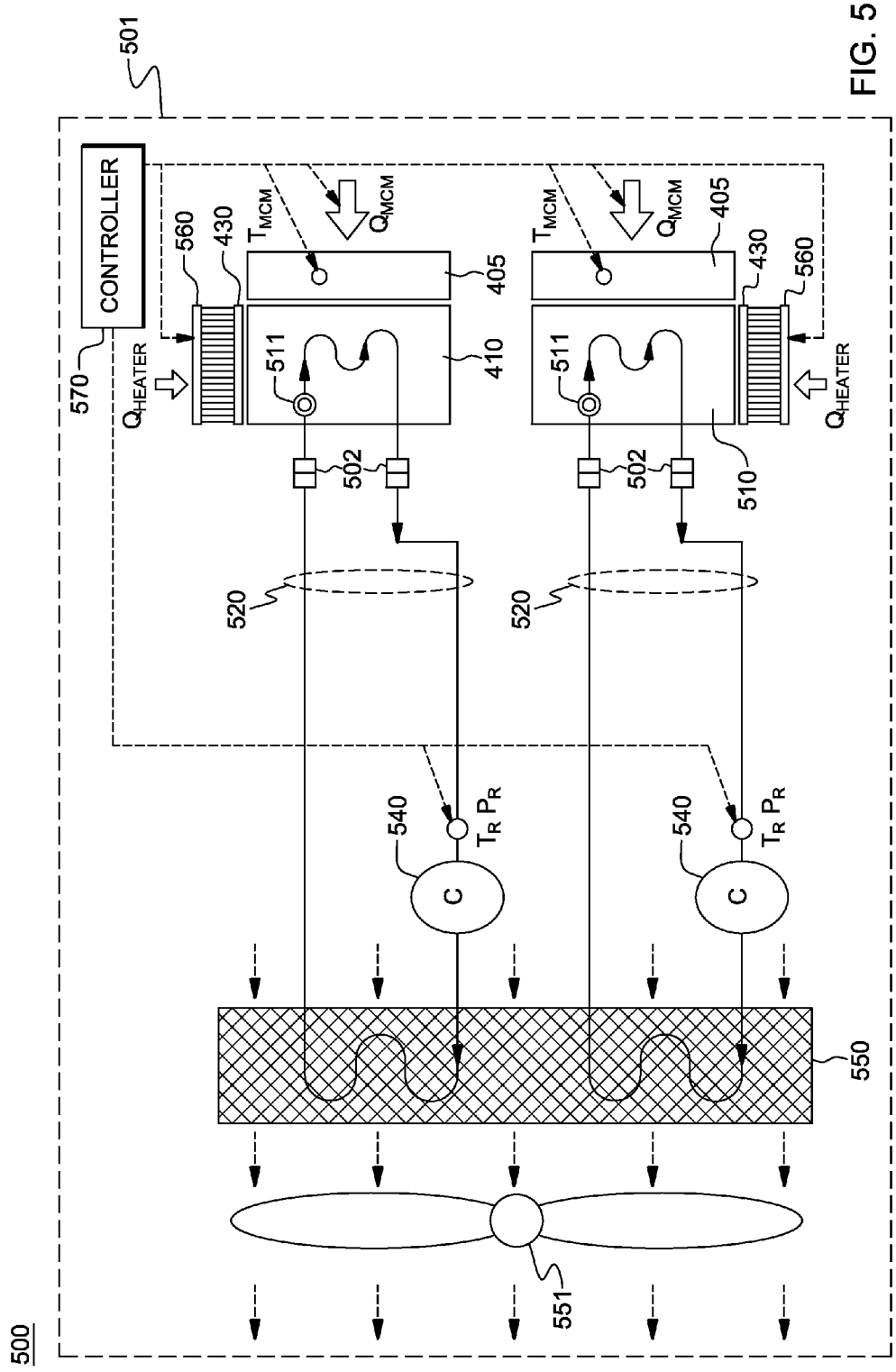
FIG. 5 is a schematic of one embodiment of a cooled electronic system comprising a vapor-compression refrigeration apparatus cooling one or more electronic components, in accordance with an aspect of the present invention.

FIG. 5 illustrates a cooled electronic system 500, which includes an electronics rack 501 comprising multiple electronic components 405 to be cooled. By way of specific example only, one or more of the electronic components 405 to be cooled by the cooling apparatus may be a multichip module (MCM), such as the processor MCM depicted in FIGS. 4A & 4B. Note that in the embodiment of FIG. 5, a dual-loop, cooled electronic system is depicted by way of example only. Those skilled in the art should note that the vapor-compression refrigeration apparatus illustrated in FIG. 5 and described below can be readily configured for cooling a single electronic component, or a plurality of electronic components (either with or without employing a shared condenser, as in the example of FIG. 5).

In the implementation of FIG. 5, the cooling apparatus is a vapor-compression refrigeration apparatus with a controlled refrigerant heat load. Refrigerant evaporator 410 is associated with a respective electronic component 405 to be cooled, and a refrigerant loop 520 is coupled in fluid communication with refrigerant evaporator 410, to allow for the ingress and egress of refrigerant through the structure. Quick connect couplings 502 are provided, which facilitate coupling of refrigerant evaporator 410 to the remainder of the cooling apparatus. Each refrigerant loop 520 is in fluid communication with a respective compressor 540, a condenser section passing through a shared condenser 550, and a filter/dryer (not shown). An air-moving device 551 facilitates airflow across shared condenser 550. Note that, in an alternate implementation, each refrigerant loop of the vapor-compression refrigeration apparatus could incorporate its own condenser and air-moving device. In the embodiment of FIG. 5, each refrigerant loop 520 also includes a fixed orifice expansion valve 511 associated with the respective refrigerant evaporator 410 and disposed, for example, at a refrigerant inlet to the refrigerant evaporator 410.

In accordance with an aspect of the present invention, the vapor-compression refrigeration apparatus further includes a controllable refrigerant heater 560 associated with air-cooled heat sink 430. Controllable refrigerant heater 560 is in thermal communication across the air-cooled heat sink with refrigerant passing through the refrigerant evaporator for controllably applying (in the primary, refrigeration cooling mode) an auxiliary heat load thereto, as described further below. Note that, in one implementation, electronic component 405 is coupled to a first main surface of refrigerant evaporator 410, and air-cooled heat sink 430 (with the controllable refrigerant heater coupled or integrated therewith) is coupled to a second main surface of refrigerant evaporator 410. Advantageously, by coupling the refrigerant heater to the heat sink, controllable refrigerant heater 560 is in thermal communication with refrigerant passing through the refrigerant evaporator without any redesign of the refrigerant loop with respect to plumbing or other connections.

A controller 570 is provided electrically coupled to the controllable refrigerant heaters, refrigerant temperature and pressure sensors $T_R$, $P_R$, and MCM heat load sensors $Q_{MCM}$ for facilitating control of the vapor-compression refrigeration process within each cooling apparatus, for example, as described further below with reference to the control processes of FIGS. 9A & 9B. Each controllable refrigerant heater is associated with and in thermal communication with a respective refrigerant loop 520 to (in the primary, refrigeration cooling mode) selectively apply a desired heat load to refrigerant in the refrigerant loop to ensure that refrigerant entering the compressor is in a superheated thermodynamic state.

In operation, each electronic component 405 applies a heat load $Q_{MCM}$ to refrigerant passing through refrigerant evaporator 410. In addition, each controllable refrigerant heater 560 applies an auxiliary heat load $Q_{HEATER}$ to refrigerant passing through refrigerant evaporator 410, which together with the electronic component heat load ($Q_{MCM}$), ensures that refrigerant entering compressor 540 is in a superheated thermodynamic state. Heat is rejected from the refrigerant in refrigerant loop 520 to an air stream via the air-cooled condenser 550, and liquid refrigerant is circulated from condenser 550 back to refrigerant evaporator 410 to repeat the process. Advantageously, by ensuring that refrigerant entering the compressor is in a superheated thermodynamic state, the compressor 540 can work at a fixed speed, and a fixed orifice 511 can be used within refrigerant loop 520 as the expansion valve for the vapor-compression refrigeration apparatus. The application of an adjustable, auxiliary heat load by the controllable refrigerant heater to the refrigerant passing through the refrigerant evaporator means that a desired heat load can be maintained within the refrigerant loop, and by prespecifying this desired, specified heat load, superheated refrigerant can be guaranteed to enter the compressor, allowing for reliable operation of the vapor-compression refrigeration apparatus. The controllable refrigerant heater can be controlled using a variety of approaches, with various thermal measurements being employed and transmitted to the controller to incrementally adjust the heat load being applied by the controllable refrigerant heater to the circulating refrigerant.

Advantageously, the use of a cooling apparatus such as depicted in FIG. 5 addresses electronic component heat load changes by, for example, maintaining a specified heat load on the refrigerant in the refrigerant loop. The controllable refrigerant heater may be controlled based, for example, on current heat load provided by (or current temperature of) the electronic component, or alternatively, based on temperature and pressure of refrigerant within the refrigerant loop, as respectively depicted in FIGS. 9A & 9B. Advantageously, within the cooling apparatus described herein, the refrigerant loop may be hard-plumbed, and a constant speed compressor may be employed, along with a fixed expansion orifice. This enables a minimum amount of controls on the refrigerant loop. The resulting cooling apparatus can be packaged inside a modular refrigerant unit-like subassembly, such as depicted above in connection with FIG. 2A.

FIGS. 6A-8C depict alternate implementations of a controllable refrigerant heater, in accordance with various aspects of the present invention. In FIGS. 6A-6E, a comb-type heater structure is depicted, in FIGS. 7A-7F a grooved heater structure is illustrated, and in FIGS. 8A-8C a slatted heater structure is shown.

Figure 6A:
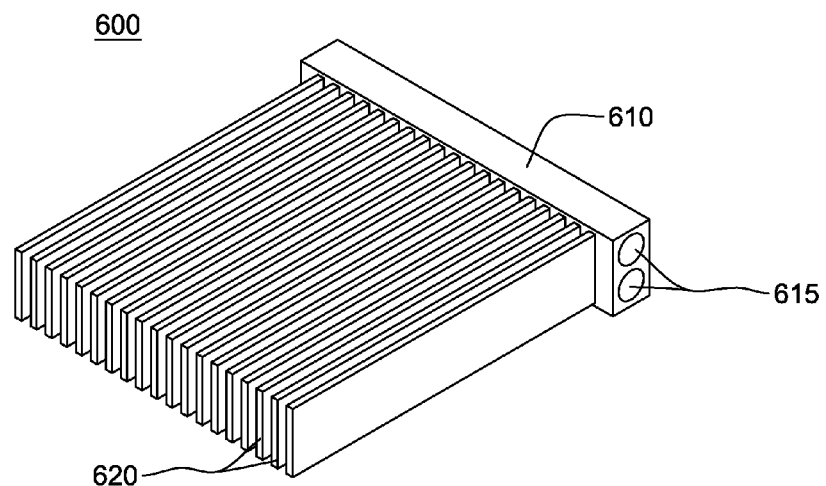
FIG. 6A is an isometric view of one embodiment of a controllable refrigerant heater configured to couple to an air-cooled heat sink of a vapor-compression refrigeration apparatus such as depicted in FIGS. 4A-5, in accordance with an aspect of the present invention.
Figure 6B:
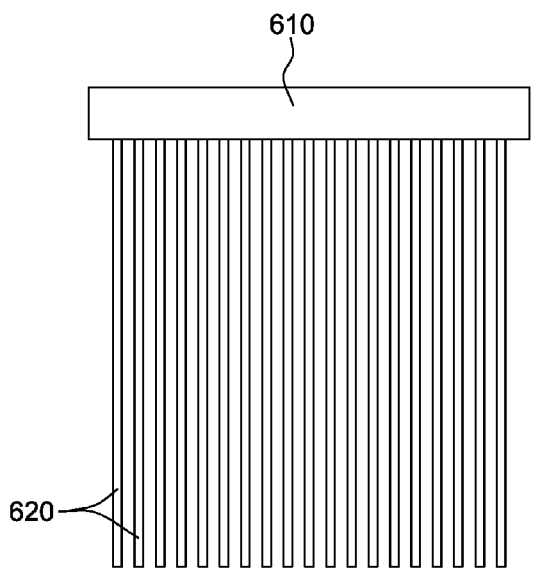
FIG. 6B depicts a plan view of the controllable refrigerant heater of FIG. 6A, in accordance with an aspect of the present invention.
Figure 6C:
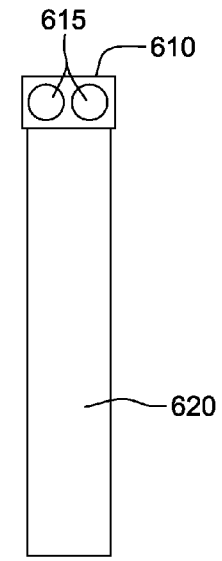
FIG. 6C depicts an end elevational view of the controllable refrigerant heater of FIGS. 6A & 6B, in accordance with an aspect of the present invention.

Referring first to the comb-type heater of FIGS. 6A-6C, controllable refrigerant heater 600 is shown to comprise a heater block 610 and a plurality of thermally conductive heater fins 620 extending from heater block 610. Heater block 610 is a thermally conductive material and includes one or more openings or chambers which accommodate, for example, one or more electrically controllable heaters 615 therein. In one specific example, multiple cylindrical cavities are provided within heater block 610 for accommodating cylindrical-shaped or cartridge-type heaters 615 therein.

Figure 6D:
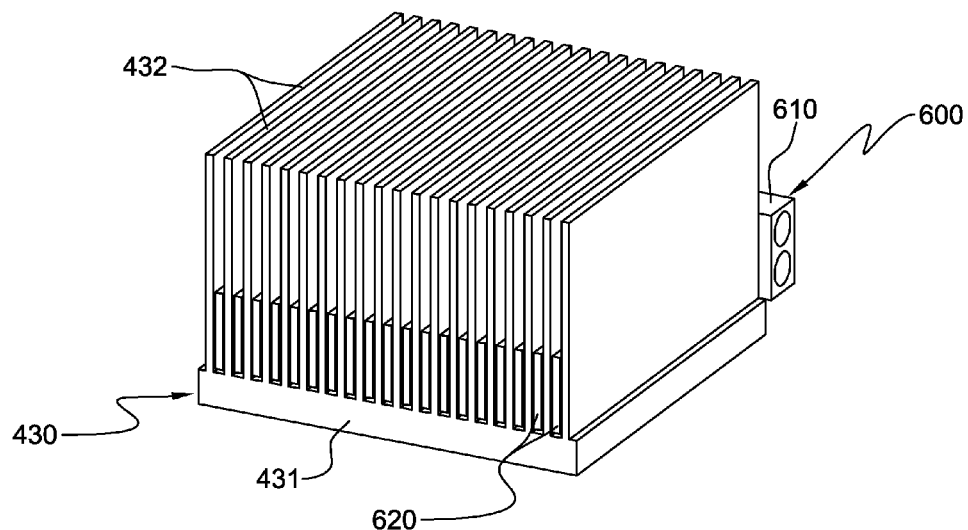
FIG. 6D is an isometric view of an interdigitated assembly comprising the controllable refrigerant heater of FIGS. 6A-6C coupled to an air-cooled heat sink comprising a plurality of thermally conductive heat sink fins such as depicted in the vapor-compression refrigeration apparatus illustrated in FIGS. 4A-5, in accordance with an aspect of the present invention.

FIG. 6D depicts an integrated assembly, or more particularly in this case, an interdigitated assembly, comprising air-cooled heat sink 430 and controllable refrigerant heater 600. Interdigitation is achieved by configuring and sizing the plurality of thermally conductive heater fins 620 (and/or the plurality of thermally conductive heat sink fins 432) appropriately such that the plurality of thermally conductive heater fins 620 can reside between and interleave with the plurality of thermally conductive heat sink fins 432 extending from heat sink base 431, as illustrated. In the interdigitated assembly, the plurality of thermally conductive heater fins 620 extend from heater block 610 in a first direction that is perpendicular to a second direction within which the plurality of thermally conductive heat sink fins 432 extend from heat sink base 431 of air-cooled heat sink 430.

Figure 6E:
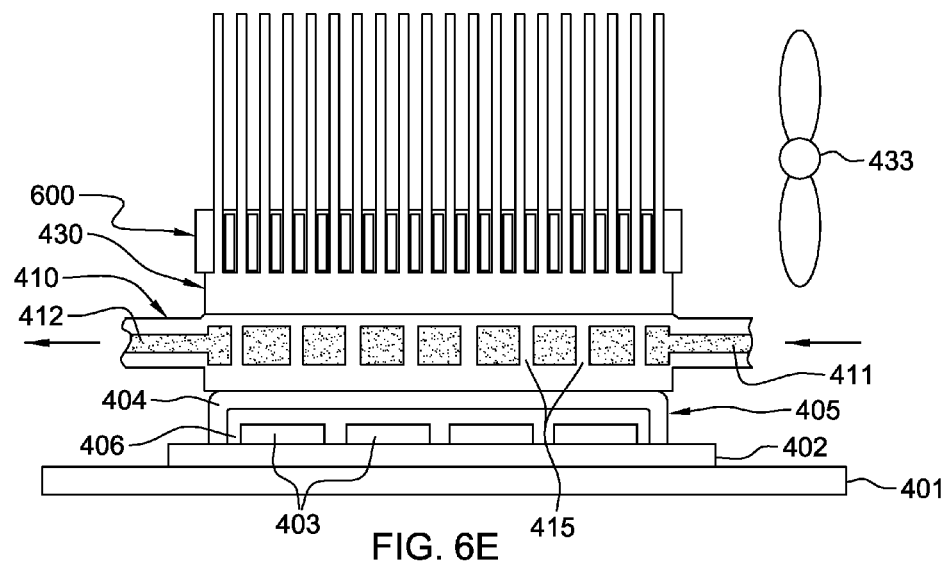
FIG. 6E is an elevational view of the interdigitated assembly of FIG. 6D coupled to a refrigerant evaporator of a vapor-compression refrigeration apparatus such as depicted in FIGS. 4A-5, in accordance with an aspect of the present invention.

In FIG. 6E, the integrated assembly of FIG. 6D is substituted for the air-cooled heat sink illustrated in FIGS. 4A & 4B. As shown, the interdigitated assembly (comprising air-cooled heat sink 430 and controllable refrigerant heater 600) is coupled to the second main surface of refrigerant evaporator 410, the first main surface of which is coupled to electronic component 405 to be cooled. In FIG. 6E, primary, refrigeration cooling mode of the cooling apparatus is illustrated, with air-moving device 433 OFF. In this mode, the auxiliary heat load supplied by controllable refrigerant heater 600 is conducted across air-cooled heat sink 430 through, for example, one or more thermally conductive heat sink fins and a heat sink base, to refrigerant evaporator 410 and subsequently to the refrigerant passing through refrigerant evaporator 410. Advantageously, by inserting the controllable refrigerant heater as close to the heat sink base as possible, the length of the thermal conduction paths required for the auxiliary heat load to traverse is reduced. If desired, the length of the thermally conductive heat sink fins may be extended to account for the interdigitated fin heat transfer area. Depending upon the configuration of the air-cooled heat sink, multiple controllable refrigerant heaters may be employed to engage the heat sink from, for example, opposite sides, so as to reduce the length of the heat conduction paths from the heater(s) within the heater block(s) to the refrigerant evaporator 410.

FIGS. 7A-7D depict an alternate embodiment of a controllable refrigerant heater 700, in accordance with an aspect of the present invention. In this embodiment, controllable refrigerant heater 700 is one example of a grooved heater structure that may be integrated with an air-cooled heat sink using, for example, a thermal interface material (TIM), as described further below. Controllable refrigerant heater 700 includes a heater block 710 which, in this embodiment, is configured with a plurality of openings to accommodate heaters 715, and a plurality of grooves 720 sized and positioned to receive respective thermally conductive heat sink fins, as illustrated in FIGS. 7E & 7F.

Figure 7A:
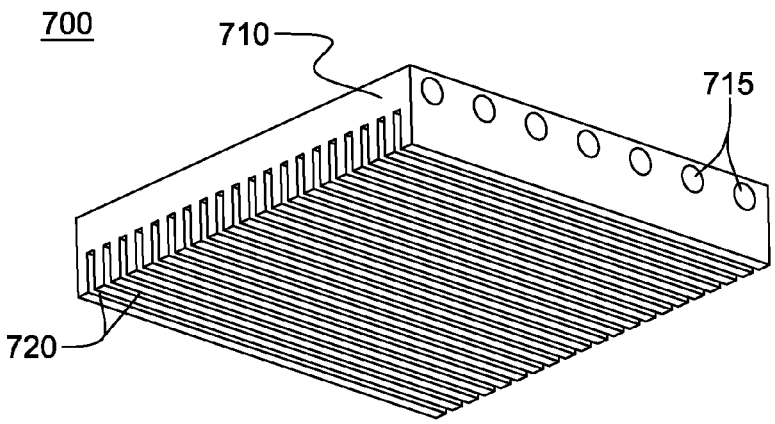
FIG. 7A is an isometric view of another embodiment of a controllable refrigerant heater configured to couple to an air-cooled heat sink of a vapor-compression refrigeration apparatus such as depicted in FIGS. 4A-5, in accordance with an aspect of the present invention.
Figure 7B:
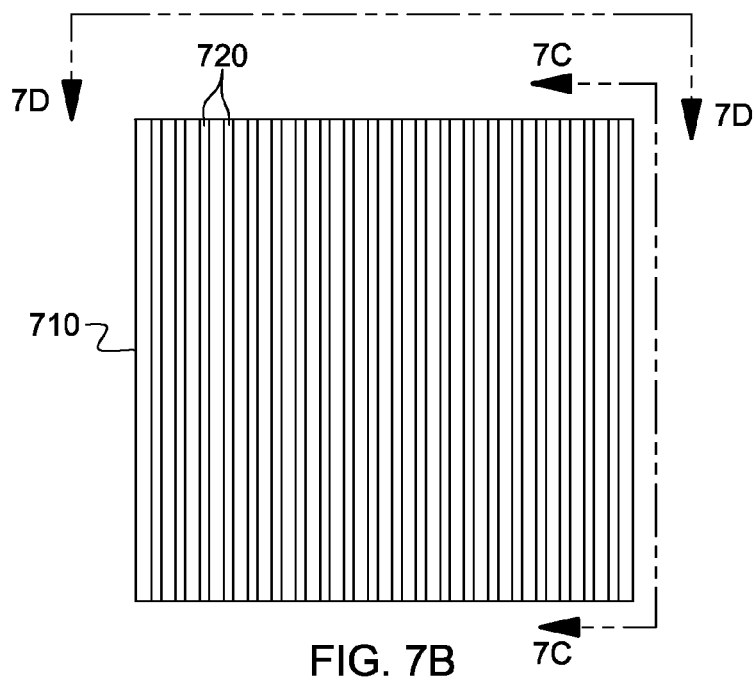
FIG. 7B is a plan view of the controllable refrigerant heater of FIG. 7A, in accordance with an aspect of the present invention.
Figure 7C:
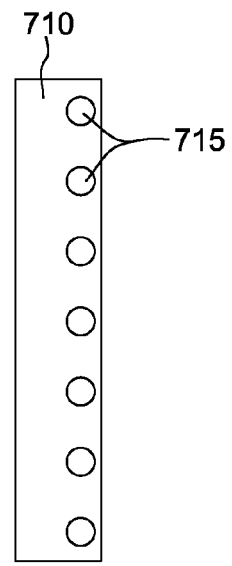
FIG. 7C is an elevational view of the controllable refrigerant heater of FIGS. 7A & 7B, viewed from line 7C-7C in FIG. 7B, in accordance with an aspect of the present invention.
Figure 7D:
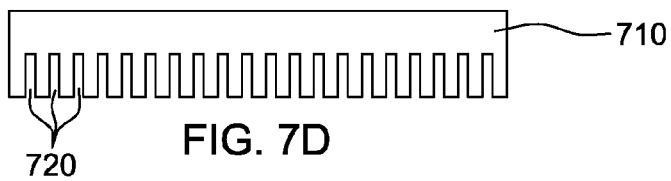
FIG. 7D is a further elevational view of the controllable refrigerant heater of FIGS. 7A-7C, view from line 7D-7D in FIG. 7B, in accordance with an aspect of the present invention.
Figure 7E:
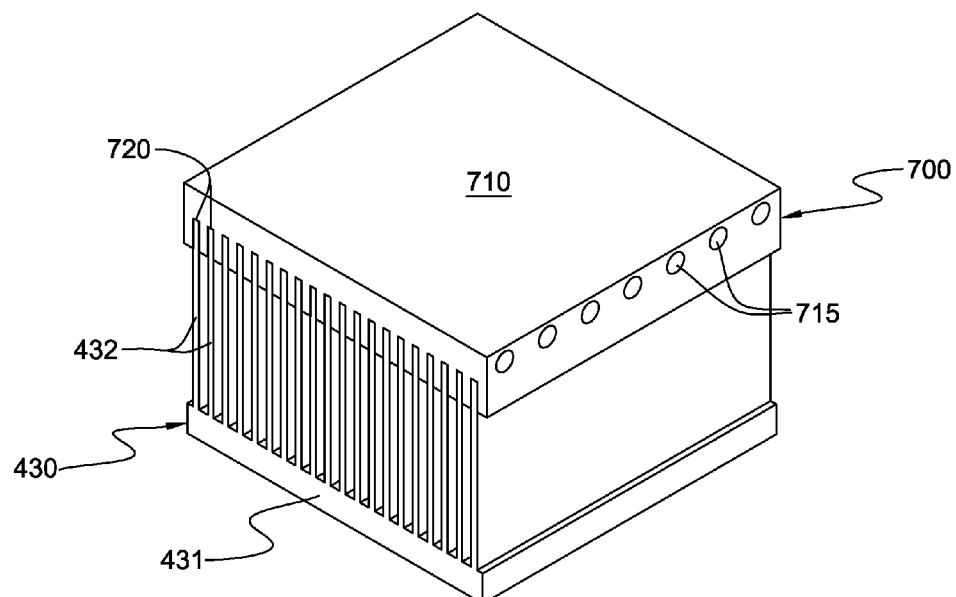
FIG. 7E is an integrated assembly comprising the controllable refrigerant heater of FIGS. 7A-7D coupled to an air-cooled heat sink comprising a plurality of thermally conductive heat sink fins such as depicted in the vapor-compression refrigeration apparatus illustrated in FIGS. 4A-5, in accordance with an aspect of the present invention.
Figure 7F:
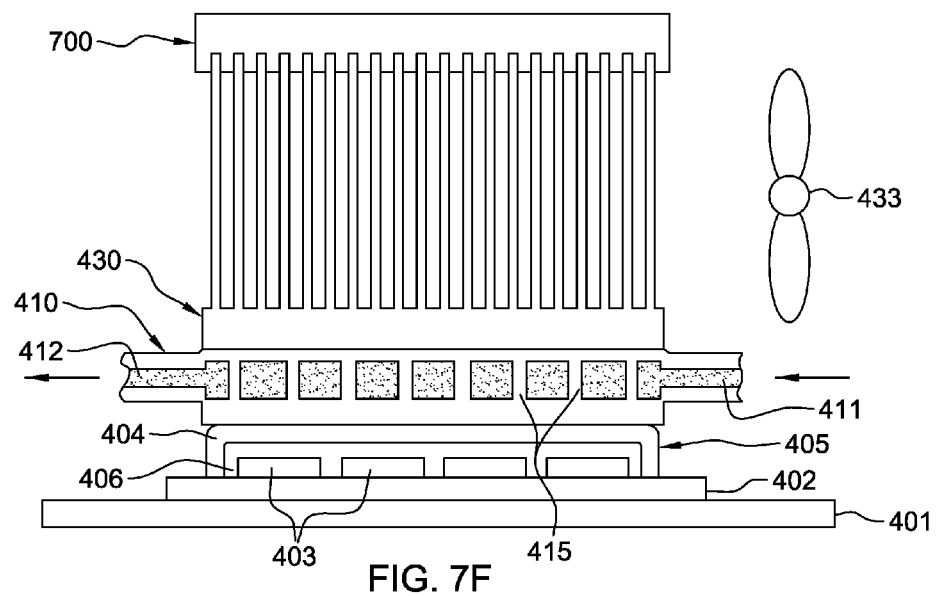
FIG. 7F is a cross-sectional elevational view of the integrated assembly of FIG. 7E coupled to a refrigerant evaporator of a vapor-compression refrigeration apparatus, shown cooling an electronic component such as depicted in FIGS. 4A-5, in accordance with an aspect of the present invention.

In FIG. 7E, an integrated assembly is depicted wherein controllable refrigerant heater 700 is coupled to the ends of thermally conductive heat sink fins 432 extending from heat sink base 431 of air-cooled heat sink 430. As noted, a thermal interface material may be employed within grooves 720 to facilitate heat conduction from controllable refrigerant heater 700 to heat sink fins 432 and hence, to the refrigerant passing through the refrigerant evaporator 410 (see FIG. 7F).

Note that in the example of FIGS. 7A-7F, heater block 710 includes cylindrical cavities positioned and sized to accommodate insertion of cartridge-type heater rods, which are (by way of example only) the source of the auxiliary heat load. In the depicted implementation, the controllable refrigerant heater is positioned such that the tips of the thermally conductive heat sink fins engage respective grooves in the heater block, and pressure may be applied using a suitable mechanical attachment mechanism (not shown) to improve the contact resistance between the structures. This particular integrated assembly may be employed, for example, where the thermally conductive heat sink fins 432 are relatively short, that is, compared with the length of the thermally conductive heat sink fins described above in connection with FIGS. 6A-6E. If desired, the overall heat sink fin length may be made longer to account for the length of the heat sink fins mating into the grooved, controllable refrigerant heater 700. The use of a flat heater, such as a foil heater for the auxiliary heat load source in lieu of the illustrated heater rods could alternatively be employed to yield a more compact design.

Figure 8A:
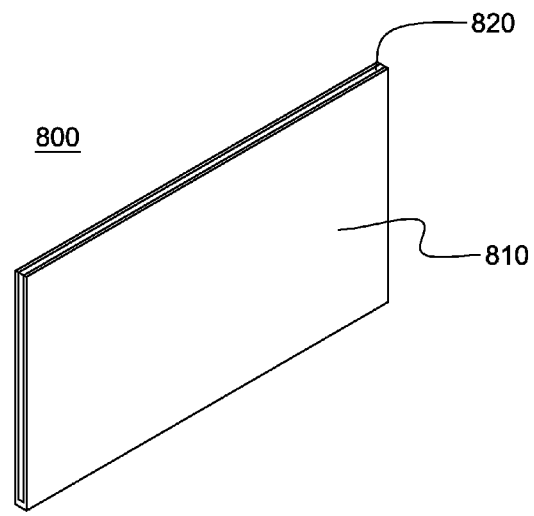
FIG. 8A is an isometric view of another embodiment of a controllable refrigerant heater configured to couple to an air-cooled heat sink of a vapor-compression refrigeration apparatus such as depicted in FIGS. 4A-5, in accordance with an aspect of the present invention.

FIG. 8A illustrates a further embodiment of a controllable refrigerant heater 800, in accordance with an aspect of the present invention. In this embodiment, the controllable refrigerant heater is a slat heater structure which comprises a flat or foil heater 820 attached to a thermally conductive housing (or shell) 810. As illustrated in FIG. 8A, in one embodiment, foil heater 820 resides within a U-shaped outer housing or shell 810.

Figure 8B:
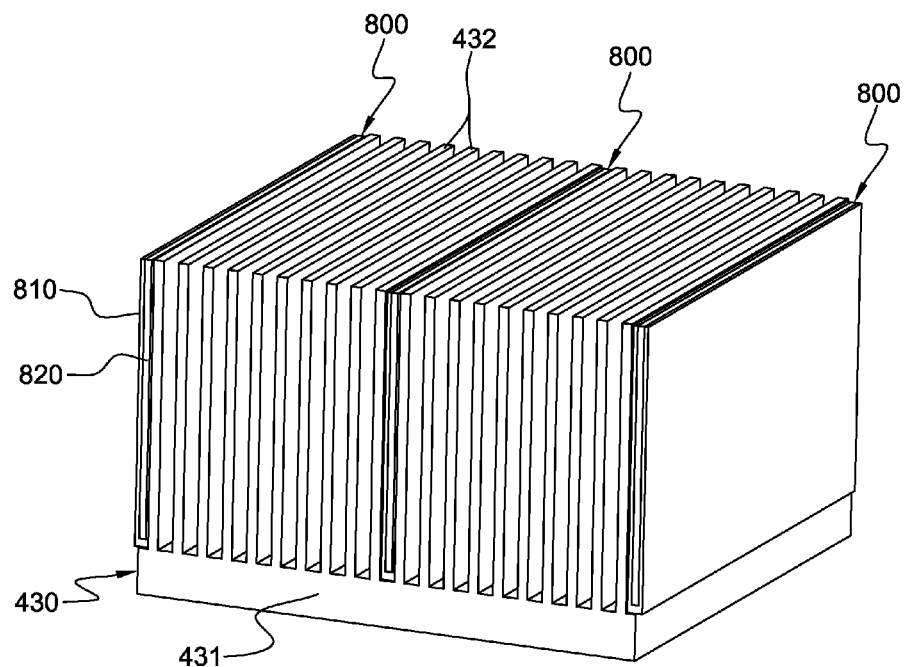
FIG. 8B is an isometric view of an integrated assembly comprising several controllable refrigerant heaters, such as depicted in FIG. 8A, integrated with an air-cooled heat sink comprising a plurality of thermally conductive heat sink fins, such as depicted with the vapor-compression refrigeration apparatuses of FIGS. 4A-5, in accordance with an aspect of the present invention.

FIG. 8B depicts an integrated assembly comprising air-cooled heat sink 430 and multiple controllable refrigerant heaters 800, each comprising a foil heater 820 disposed within a thermally conductive housing 810. The multiple controllable refrigerant heaters 800 are illustrated in FIG. 8B attached to the exposed sides of the plurality of thermally conductive heat sink fins 432, as well as disposed between two adjacent thermally conductive heat sink fins near the middle of the air-cooled heat sink 430.

Figure 8C:
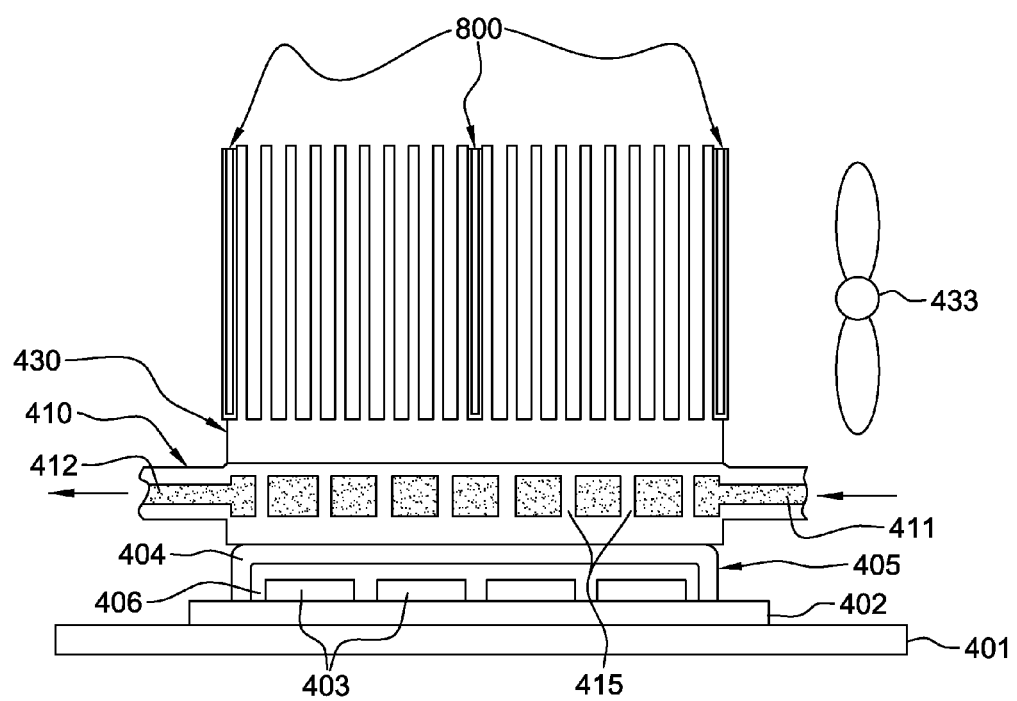
FIG. 8C is a cross-sectional elevational view of the integrated assembly of FIG. 8B coupled to a refrigerant evaporator of a vapor-compression refrigeration apparatus shown cooling an electronic component such as depicted in FIGS. 4A-5, in accordance with an aspect of the present invention

FIG. 8C depicts the integrated assembly of FIG. 8B coupled to refrigerant evaporator 410 in place of the air-cooled heat sink 430 only embodiment depicted in FIGS. 4A & 4B.

Note that the number and positioning of the controllable refrigerant heaters 800 of FIGS. 8A-8C can be arranged to spread out the input of the auxiliary heat load along the width of the heat sink base. The auxiliary heat load provided by the controllable refrigerant heaters 800 will flow into the heat sink base through the adjacent thermally conductive heat sink fins, and subsequently into the refrigerant evaporator. If desired, the air-cooled heat sink may be designed to specifically accommodate the controllable refrigerant heater by, for example, providing slightly larger dimensions where desired.

Figure 9A:
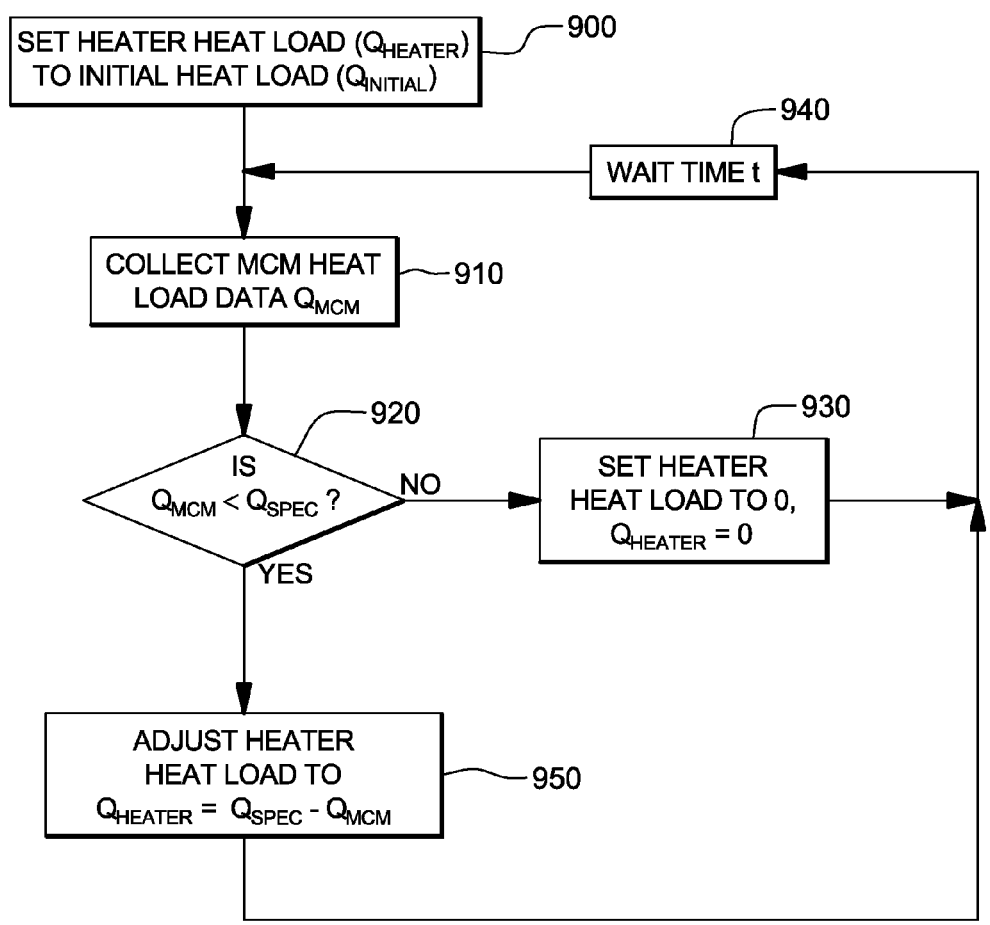
FIG. 9A is a flowchart of one embodiment of a process for ensuring that a specified heat load is dissipated to refrigerant passing through the refrigerant evaporator of the vapor-compression refrigeration apparatus of FIG. 5, in accordance with an aspect of the present invention.
Figure 9B:
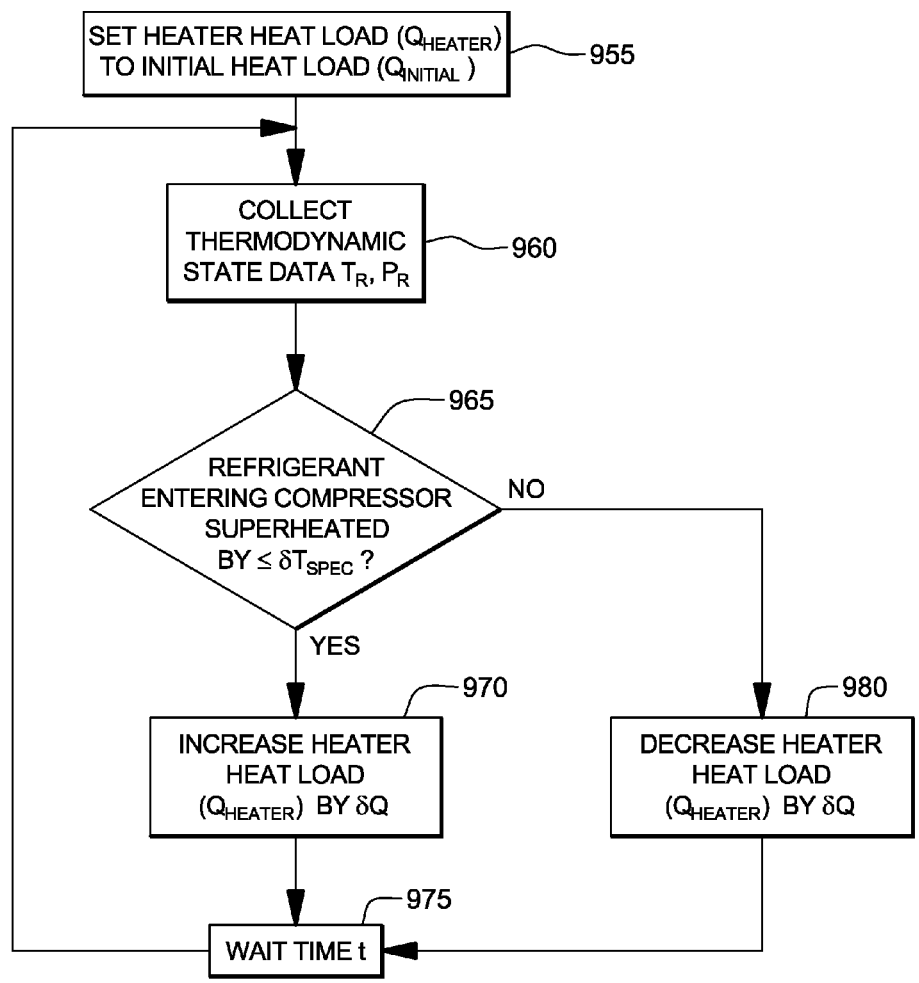
FIG. 9B is a flowchart of one embodiment of a process for maintaining refrigerant entering the compressor of the vapor-compression refrigerant apparatus of FIG. 5 in a superheated thermodynamic state, in accordance with an aspect of the present invention.

As noted, FIGS. 9A & 9B depict control processes which may be employed in connection with the vapor-compression refrigeration apparatus of FIG. 5. Referring to FIG. 9A, substantially constant refrigerant heating can be established by first setting the heat load applied to the refrigerant by the controllable refrigerant heater ($Q_{HEATER}$) equal to an initial (or nominal) heat load value ($Q_{INITIAL}$) 900. The current component heat load (e.g., power data) is collected 910. If the MCM heat load ($Q_{MCM}$) is less than a desired, specified heat load ($Q_{SPEC}$) 920, then the controllable refrigerant heater is adjusted to apply a heat load ($Q_{HEATER}$) which matches the difference 950. Otherwise, the heat load applied by the controllable refrigerant heater ($Q_{HEATER}$) is set to zero 930. After adjusting the heat load, processing waits a defined time (t) 940 before repeating the process by again collecting current component heat load data ($Q_{MCM}$) 910.

In operation, heat load input to the refrigerant in the refrigerant loop by the auxiliary controllable refrigerant heater will typically be equal to the difference between the specified electronic component heat load (e.g., the rated or maximum electronic component power) and the actual current electronic component heat load (e.g., current component power). Thus, if the electronic component is fully loaded and is running at full rated load, then the controllable refrigerant heater is OFF. In the event that the electronic component is intrinsically running at a lower power, or if the computational activity of the electronic component is reduced, thereby reducing the electronic component load, then the controllable refrigerant heater is ON and supplying power (or heat load) to the refrigerant loop that is equal to the difference, as described above. In this manner, the loading on the refrigerant loop is maintained at a relatively constant, stable value, which ensures that the compressor always receives superheated vapor by design.

FIG. 9B depicts an alternate control process which ensures that refrigerant entering the compressor is in a superheated thermodynamic state. In this approach, measurements of refrigerant temperature and refrigerant pressure at the inlet of the compressor are used to control the amount of heat load (or power) delivered by the auxiliary, controllable refrigerant heater. This advantageously allows for a stable electronic component temperature, while ensuring that superheated vapor is received into the compressor. This in turn advantageously results in the elimination of the use of any adjustable expansion valves, which might otherwise be used, and be susceptible to fouling.

Referring to FIG. 9B, a superheated thermodynamic state is ensured by first setting the heat load applied to the refrigerant by the controllable refrigerant heater ($Q_{HEATER}$) equal to an initial (or nominal) heat load value ($Q_{INITIAL}$) 955. The temperature of refrigerant ($T_R$) and pressure of refrigerant ($P_R$) at the inlet of the compressor are collected to determine the current thermodynamic state of the refrigerant 960. Processing then determines whether refrigerant entering the compressor is in a superheated state by less than or equal to a specified temperature difference ($\delta T_{SPEC}$) from the absolute value of refrigerant temperature at superheated condition 965. In one example, $\delta T_{SPEC}$ may be 2° C. This determination can be performed, by way of example, using a table look-up based on known thermodynamic properties of the refrigerant. By way of specific example, pressure (P)-enthalpy (H) diagrams for R134a refrigerant are available in the literature which indicate the regions in which the refrigerant is sub-cooled, saturated and superheated. These diagrams or functions utilize variables such as pressure and temperature (enthalpy if the quality of a two-phase mixture needs to be known). Thus, the thermodynamic state of the refrigerant can be determined using pressure and temperature data and subsequently controlled using the addition of the auxiliary heat load, if required. The pressure and temperature values measured can be input into a refrigerant-dependent algorithm (defined by the P-H diagram and properties of the refrigerant) that determines if the refrigerant is superheated (or is saturated or is in liquid phase). It is desired that the coolant entering the compressor be slightly superheated, that is, with no liquid content. The extent of superheat can be characterized using a $ET_{SPEC}$ value, which is predetermined. It is undesirable to have a very high extent of refrigerant superheat, because this would mean that a substantial heat load has been added to the refrigerant, even after the refrigerant has completely changed from liquid to gas phase. This is considered unnecessary for compressor reliability, and would lead to highly inefficient refrigeration loop operation. It is desired to add only as much auxiliary heat load as needed to maintain a small degree of superheat for the refrigerant entering the compressor to ensure reliable compressor operation. Therefore, if the refrigerant entering the compressor is superheated by less than a specified temperature difference ($\delta T_{SPEC}$), then the heat load applied by the controllable refrigerant heater is increased by a specified amount ($\delta Q$) 970. Alternatively, if the refrigerant entering the compressor is superheated by greater than the specified temperature difference ($\delta T_{SPEC}$), then the heat load applied by the controllable refrigerant heater is decreased by the specified amount (e.g., $\delta Q$) 980. After adjusting the heater heat load, processing waits a defined time (t) 975 before repeating the process by again collecting current thermodynamic state data for the refrigerant, that is, refrigerant temperature ($T_R$) and refrigerant pressure ($P_R$) at, for example, the inlet to the compressor 960.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electromagnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 10:
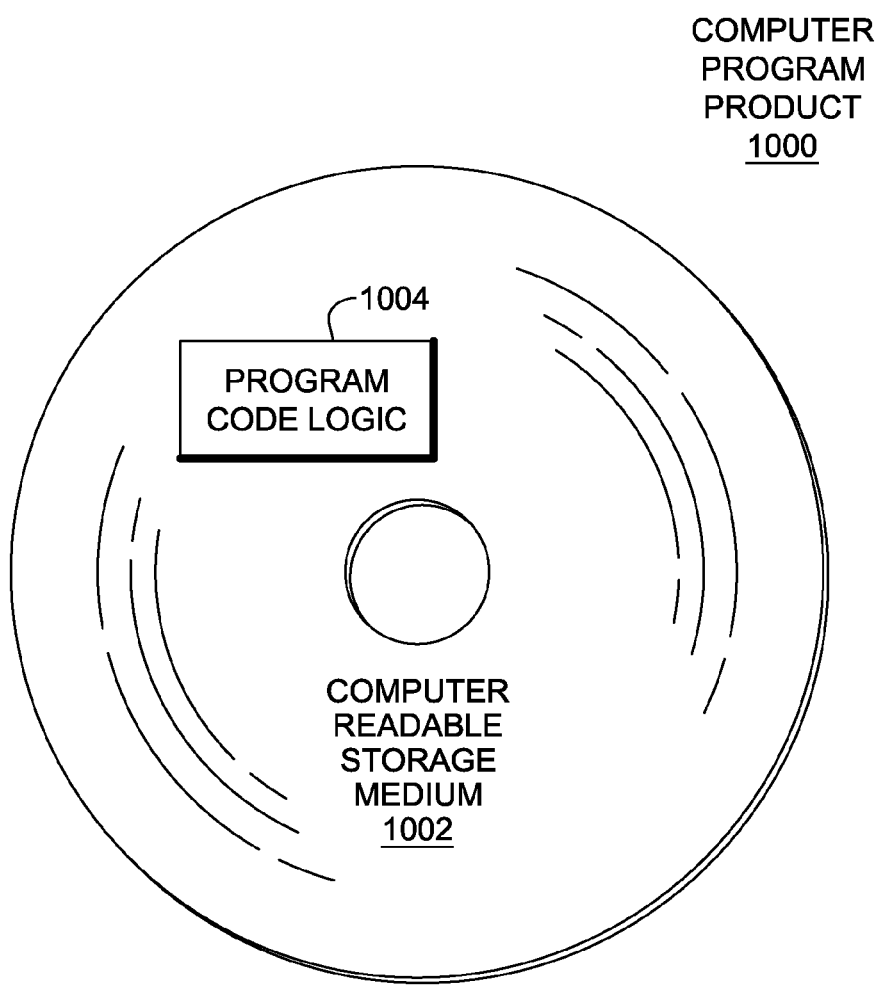
FIG. 10 depicts one embodiment of a computer program product incorporating one or more aspects of the present invention.

Referring now to FIG. 10, in one example, a computer program product 1000 includes, for instance, one or more computer readable storage media 1002 to store computer readable program code means or logic 1004 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used. Further, other types of programs and/or other optimization programs may benefit from one or more aspects of the present invention, and other resource assignment tasks may be represented. Resource assignment tasks include the assignment of physical resources. Moreover, although in one example, the partitioning minimizes communication costs and convergence time, in other embodiments, the cost and/or convergence time may be otherwise reduced, lessened, or decreased.

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. An apparatus for facilitating cooling of an electronic component, the apparatus comprising:
    a refrigerant evaporator in thermal communication with the electronic component, the refrigerant evaporator comprising at least one channel therein for accommodating flow of refrigerant through the refrigerant evaporator;
    a refrigerant loop coupled in fluid communication with the at least one channel of the refrigerant evaporator for facilitating flow of refrigerant through the refrigerant loop;
    a compressor coupled in fluid communication with the refrigerant loop;
    an air-cooled heat sink distinct from and physically coupled to the refrigerant evaporator and providing backup cooling to the electronic component in a backup, air cooling mode;
    a controllable refrigerant heater coupled to the air-cooled heat sink and in thermal communication across the air-cooled heat sink with refrigerant passing through the refrigerant evaporator, wherein the refrigerant evaporator, air-cooled heat sink, and controllable refrigerant heater are physically stacked together, with the air-cooled heat sink disposed, at least in part, between the controllable refrigerant heater and the refrigerant evaporator, the controllable refrigerant heater selectively applying a conductively transferred, auxiliary heat load across the air-cooled heat sink to refrigerant passing through the refrigerant evaporator to ensure in a primary, refrigeration cooling mode, that refrigerant in the refrigerant loop entering the compressor is in a superheated thermodynamic state; and
    wherein:
        the refrigerant evaporator comprises a first main surface and a second main surface, the first main surface and the second main surface extending substantially parallel, and wherein the electronic component is in thermal communication with the refrigerant evaporator across the first main surface of the refrigerant evaporator and the air-cooled heat sink is in thermal communication with the refrigerant evaporator across the second main surface of the refrigerant evaporator;
        the air-cooled heat sink comprises a heat sink base coupled to the second main surface of the refrigerant evaporator and a plurality of thermally conductive heat sink fins extending from the heat sink base;
        the controllable refrigerant heater couples at least partially to at least one thermally conductive heat sink fin of the plurality of thermally conductive heat sink fins of the air-cooled heat sink and is in thermal communication with refrigerant passing through the refrigerant evaporator across, at least in part the at least one thermally conductive heat sink fin: and
        the controllable refrigerant heater comprises a heater block and a plurality of thermally conductive heater fins extending from the heater block and wherein the controllable refrigerant heater is coupled to the air-cooled heat sink with the plurality of thermally conductive heater fins interdigitated with the plurality of thermally conductive heat sink fins.

2. The apparatus of claim 1, wherein the refrigerant evaporator further comprises a plurality of heat conduction structures facilitating conducting heat from the electronic component to the air-cooled heat sink in the backup, air cooling mode, the plurality of heat conduction structures further facilitating conduction of the auxiliary heat load to refrigerant passing through the refrigerant evaporator in the primary, refrigeration cooling mode.

3. The apparatus of claim 1, further comprising a thermal interface material disposed between at least two opposing surfaces of the interdigitated plurality of thermally conductive heater fins and plurality of thermally conductive heat sink fins.

4. The apparatus of claim 1, wherein the plurality of thermally conductive heat sink fins extend in a first direction and the plurality of thermally conductive heater fins extend in a second direction, the first direction and the second direction being perpendicular directions.

5. The apparatus of claim 1, further comprising a controller coupled to the controllable refrigerant heater for automatically controlling the auxiliary heat load, applied by the controllable refrigerant heater to refrigerant passing through the refrigerant evaporator, wherein the controller periodically monitors a current heat load of the electronic component and, responsive thereto, automatically determines whether the current heat load of the electronic component is above a specified heat load, and responsive to the current heat load of the electronic component being above the specified heat load, automatically sets the auxiliary heat load applied by the controllable refrigerant heater to zero, and responsive to the current heat load of the electronic component being below the specified heat load, automatically sets the auxiliary heat load applied by the controllable refrigerant heater to the refrigerant passing through the refrigerant evaporator to the specified heat load less the current heat load of the electronic component.

6. A cooled electronic system comprising:
an electronic component; and
an apparatus for cooling the electronic component, the apparatus comprising;
a refrigerant evaporator in thermal communication with the electronic component, the refrigerant evaporator comprising at least one channel therein for accommodating flow of refrigerant through the refrigerant evaporator;
a refrigerant loop coupled in fluid communication with the at least one channel of the refrigerant evaporator for facilitating flow of refrigerant through the refrigerant loop;
a compressor coupled in fluid communication with the refrigerant loop;
an air-cooled heat sink distinct from and physically coupled to the refrigerant evaporator and providing backup cooling to the electronic component in a backup, air cooling mode;
a controllable refrigerant heater coupled to the air-cooled heat sink and in thermal communication across the air-cooled heat sink with refrigerant passing through the refrigerant evaporator, wherein the refrigerant evaporator, air-cooled heat sink, and controllable refrigerant heater are physically stacked together, with the air-cooled heat sink disposed, at least in part, between the controllable refrigerant heater and the refrigerant evaporator, the controllable refrigerant heater selectively applying a conductively transferred, auxiliary heat load across the air-cooled heat sink to refrigerant passing through the refrigerant evaporator to ensure in a primary, refrigeration cooling mode, that refrigerant in the refrigerant loop entering the compressor is in a superheated thermodynamic state; and wherein:
the refrigerant evaporator comprises a first main surface and a second main surface, the first main surface and the second main surface extending substantially parallel, and wherein the electronic component is in thermal communication with the refrigerant evaporator across the first main surface of the refrigerant evaporator and the air-cooled heat sink is in thermal communication with the refrigerant evaporator across the second main surface of the refrigerant evaporator;
the air-cooled heat sink comprises a heat sink base coupled to the second main surface of the refrigerant evaporator and a plurality of thermally conductive heat sink fins extending from the heat sink base, and wherein the controllable refrigerant heater couples at least partially to at least one thermally conductive heat sink fin of the plurality of thermally conductive heat sink fins of the air-cooled heat sink, and is in thermal communication with refrigerant passing through the refrigerant evaporator across at least in part the at least one thermally conductive heat sink fin: and
the controllable refrigerant heater comprises a heater block and a plurality of thermally conductive heater fins extending from the heater block and wherein the controllable refrigerant heater is coupled to the air-cooled heat sink with the plurality of thermally conducive heater fins interdigitated with the plurality of thermally conductive heat sink fins.

7. The cooled electronic system of claim 6, wherein the plurality of thermally conductive heat sink fins extend in a first direction and the plurality of thermally conductive heater fins extend in a second direction, the first direction and the second direction being perpendicular directions.

8. A method of facilitating cooling of an electronic component, the method comprising:
coupling in thermal communication a refrigerant evaporator to the electronic component, the refrigerant evaporator comprising at least one channel therein for accommodating flow of refrigerant through the refrigerant evaporator;
providing a refrigerant loop in fluid communication with the at least one channel of the refrigerant evaporator for facilitating flow of refrigerant through the refrigerant loop;
coupling a compressor in fluid communication with the refrigerant loop;
coupling a distinct air-cooled heat sink to the refrigerant evaporator for providing backup cooling to the electronic component in a backup, air cooling mode;
coupling a controllable refrigerant heater to the air-cooled heat sink, the controllable refrigerant heater being in thermal communication across the air-cooled heat sink with refrigerant passing through the refrigerant evaporator, wherein the refrigerant evaporator, air-cooled heat sink, and controllable refrigerant heater are physically stacked together, with the air-cooled heat sink disposed, at least in part, between the controllable refrigerant heater and the refrigerant evaporator, and the controllable refrigerant heater selectively applies a conductively transferred, auxiliary heat load across the air-cooled heat sink to refrigerant passing through the refrigerant evaporator to ensure in a primary refrigeration cooling mode, that refrigerant in the refrigerant loop entering the compressor is in a superheated thermodynamic state;

wherein:
- the refrigerant evaporator comprises a first main surface and a second main surface, the first main surface and the second main surface extending substantially parallel, and wherein the electronic component is in thermal communication with the refrigerant evaporator across the first main surface of the refrigerant evaporator and the sir-cooled heat sink is in thermal communication with the refrigerant evaporator across the second main surface of the refrigerant evaporator;
- the air-cooled heat sink comprises a heat sink base coupled to the second main surface of the refrigerant evaporator and a plurality of thermally conductive heat sink fins extending from the heat sink base;
- the controllable refrigerant heater couples at least partially to at least one thermally conductive heat sink fin of the plurality of thermally conductive heat sink fins of the air-cooled heat sink, and is in thermal communication with refrigerant passing through the refrigerant evaporator across, at least in part, the at least one thermally conductive heat sink fin; and
- the controllable refrigerant heater comprises a heater block and a plurality of thermally conductive heater fins extending from the heater block and wherein the controllable refrigerant heater is coupled to the air-cooled heat sink with the plurality of thermally conductive heater fins interdigitated with the plurality of thermally conductive heat sink fins.

\* \* \* \* \*